United States Patent
Sakuma

(10) Patent No.: US 8,987,131 B2
(45) Date of Patent: Mar. 24, 2015

(54) FORMATION OF THROUGH-SILICON VIA (TSV) IN SILICON SUBSTRATE

(75) Inventor: Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/597,948

(22) Filed: Aug. 29, 2012

(65) Prior Publication Data
US 2013/0049193 A1    Feb. 28, 2013

Related U.S. Application Data

(63) Continuation of application No. 13/466,160, filed on May 8, 2012, now abandoned.

(30) Foreign Application Priority Data

May 12, 2011 (JP) ................................. 2011-107280

(51) Int. Cl.
*H01L 21/44* (2006.01)
*H01L 21/768* (2006.01)
(Continued)

(52) U.S. Cl.
CPC ........ *H01L 21/76898* (2013.01); *H01L 23/481* (2013.01); *H01L 23/147* (2013.01); *H01L 25/0657* (2013.01); *H01L 23/49827* (2013.01); *H01L 21/486* (2013.01); *H01L 23/3128* (2013.01); *H01L 2224/73204* (2013.01); *H01L 2924/15311* (2013.01); *H01L 24/16* (2013.01); *H01L 24/81* (2013.01);
(Continued)

(58) Field of Classification Search
CPC ..................... H01L 2224/48227; H01L 24/16; H01L 2225/06517; H01L 2224/81; H01L 23/481; H01L 24/73; H01L 2924/1517; H01L 24/14; H01L 25/18; H01L 21/486; H01L 21/768; H01L 24/13; H01L 23/488; H01L 24/81; H01L 23/498; H01L 23/48; H01L 21/4857; H01L 23/4951; H01L 23/5226; H01L 23/538
USPC .......... 438/612–613, 618, 667; 257/686, 737, 257/774, E21.586, E21.589, E23.011, 257/E23.068
See application file for complete search history.

(56) References Cited

U.S. PATENT DOCUMENTS

| 6,808,568 B2 | 10/2004 | Sekine |
| 2005/0184377 A1 * | 8/2005 | Takeuchi et al. .............. 257/686 |
| 2009/0090543 A1 * | 4/2009 | Furuyama et al. ............ 174/257 |

FOREIGN PATENT DOCUMENTS

| JP | 2003069194 | 3/2003 |
| JP | 2005109515 | 4/2005 |

(Continued)

*Primary Examiner* — Theresa T Doan
(74) *Attorney, Agent, or Firm* — Derek S. Jennings; Patent Mining Works, LLC

(57) ABSTRACT

To form a through-silicon via (TSV) in a silicon substrate without using plating equipment or using sputtering equipment or small metal particles, and form an interlayer connection by stacking a plurality of such silicon substrates, a through hole of a silicon substrate is filled using molten solder itself. In detail, solid solder placed above the through hole of the silicon substrate is molten and the molten solder is guided to and filled in the internal space. A metal layer can be deposited on an internal surface of the through hole beforehand, and also an intermetallic compound (IMC) can be formed in a portion other than the metal layer.

1 Claim, 6 Drawing Sheets

(51) Int. Cl.
  *H01L 23/48* (2006.01)
  *H01L 23/14* (2006.01)
  *H01L 25/065* (2006.01)
  *H01L 23/498* (2006.01)
  *H01L 21/48* (2006.01)
  *H01L 23/31* (2006.01)
  *H01L 23/00* (2006.01)

(52) U.S. Cl.
  CPC ............... *H01L 2224/0557* (2013.01); *H01L 2224/13025* (2013.01); *H01L 2224/131* (2013.01); *H01L 2224/16146* (2013.01); *H01L 2224/16227* (2013.01); *H01L 2224/17181* (2013.01); *H01L 2224/81815* (2013.01); *H01L 2224/9202* (2013.01); *H01L 2225/06517* (2013.01); *H01L 2225/06513* (2013.01); *H01L 2225/06541* (2013.01); *H01L 2225/06565* (2013.01); *H01L 2924/01327* (2013.01); *H01L 2924/10253* (2013.01); *H01L 2224/16225* (2013.01)
  USPC ........... 438/612; 438/613; 438/618; 438/667; 257/737; 257/774

(56) References Cited

FOREIGN PATENT DOCUMENTS

JP        2005191109        7/2005
JP        92006165508       6/2006

\* cited by examiner

FIG. 3  Cu-Sn System Phase Diagram

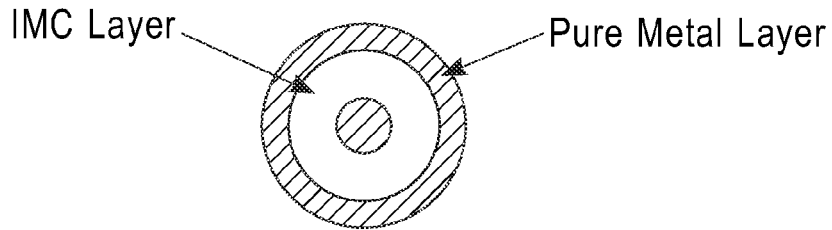
Cross Section Of TSV As Viewed From Above
Calculation Value Of Skin Depth By Skin Effect (Unit:μm)
| Frequency (GHz) | 0.1 | 0.3 | 0.5 | 1 | 3 | 5 | 10 |
|---|---|---|---|---|---|---|---|
| Copper | 6.61 | 3.81 | 2.95 | 2.09 | 1.21 | 0.93 | 0.66 |
| Silver | 6.42 | 3.70 | 2.87 | 2.03 | 1.17 | 0.91 | 0.64 |
| Gold | 7.57 | 4.37 | 3.38 | 2.39 | 1.38 | 1.07 | 0.76 |
| Aluminum | 8.37 | 4.83 | 3.74 | 2.65 | 1.53 | 1.18 | 0.84 |
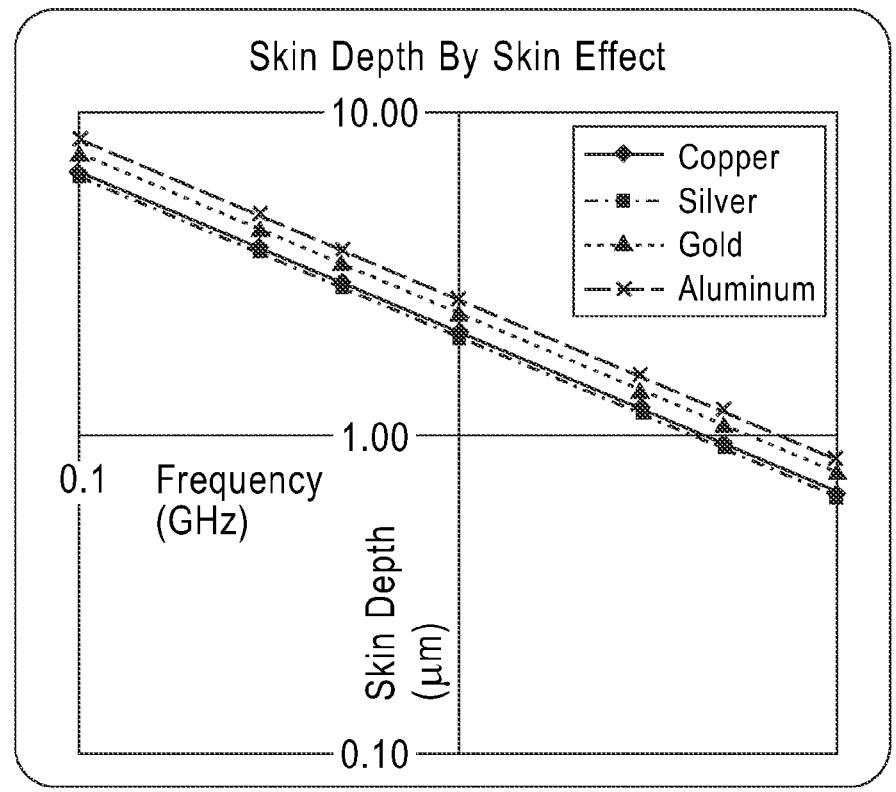
FIG. 4

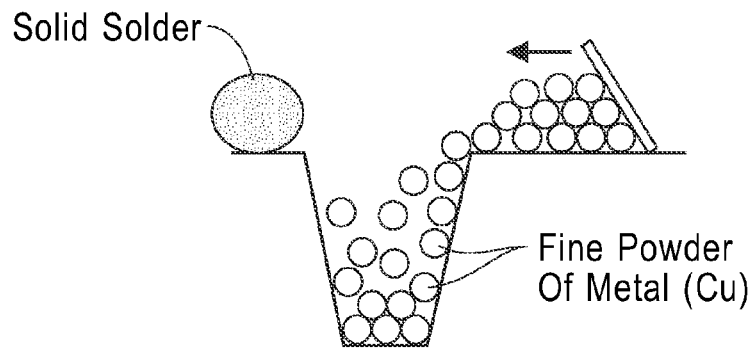
FIG. 5
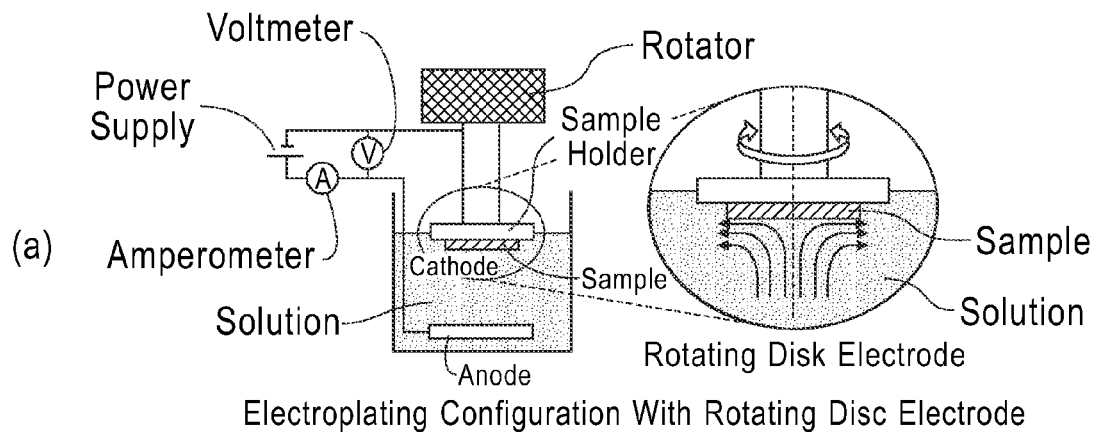
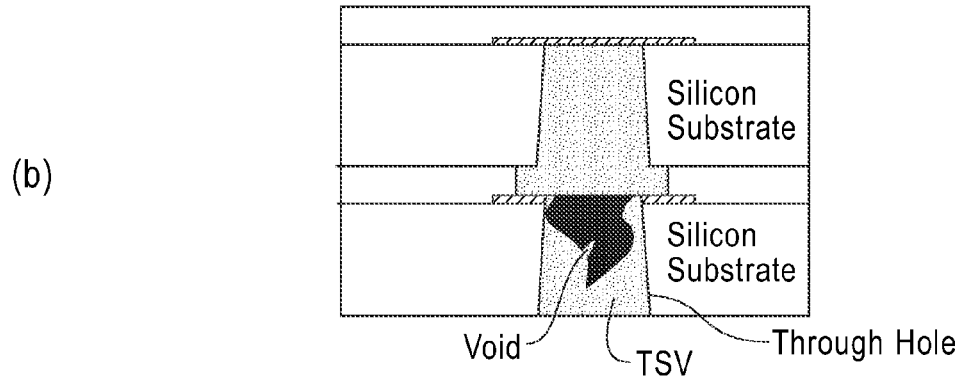
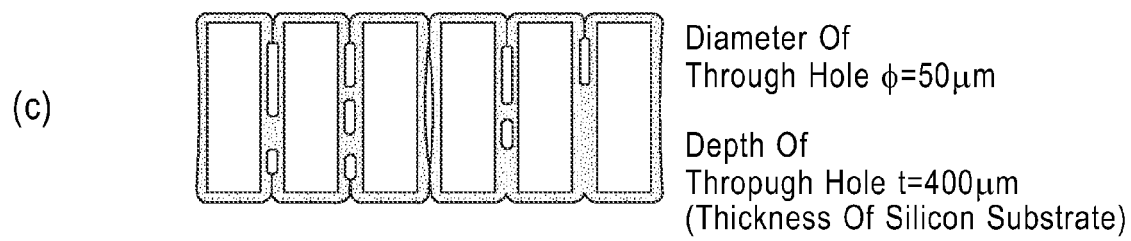
FIG. 6 (Prior Art)

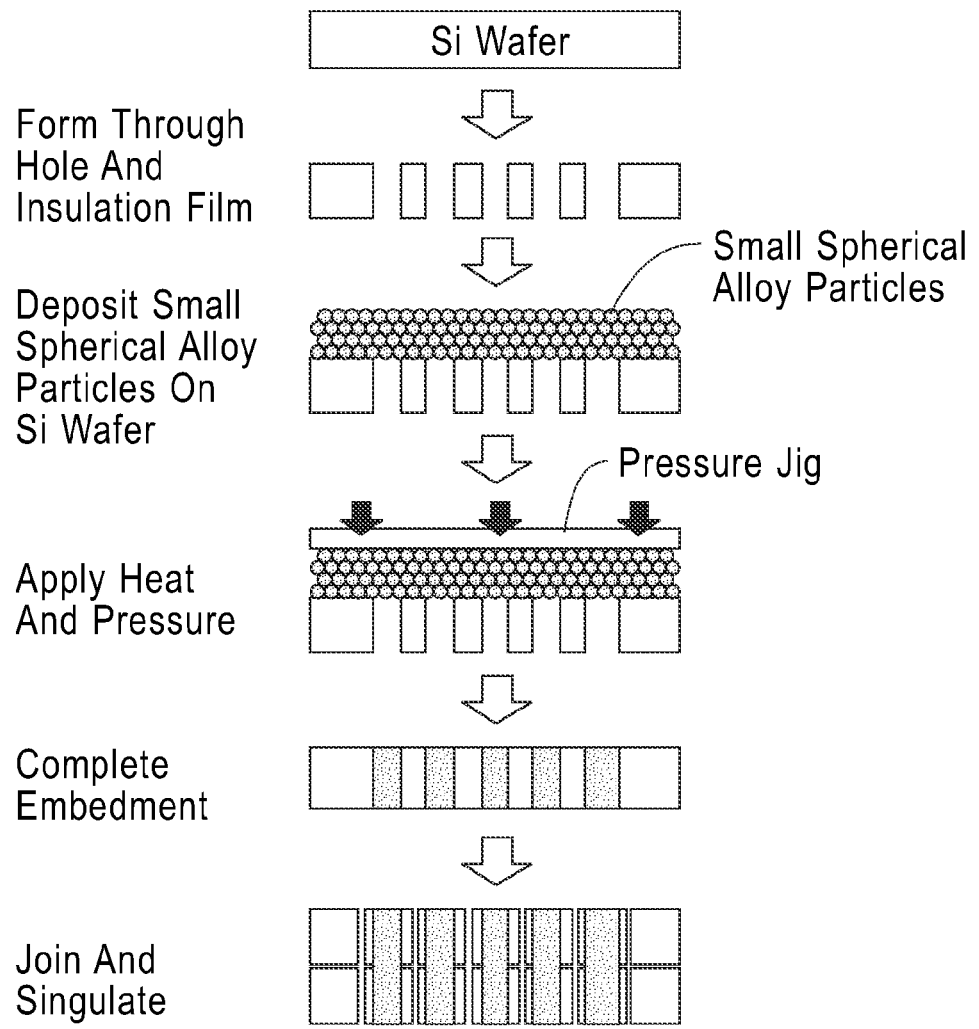
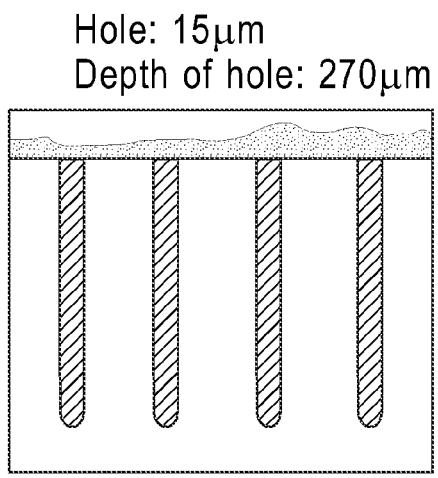
FIG. 7 (Prior Art)

FORMATION OF THROUGH-SILICON VIA (TSV) IN SILICON SUBSTRATE

CROSS-REFERENCE TO RELATED APPLICATION

This application is a continuation of and claims priority from U.S. patent application Ser. No. 13/466,160, filed May 8, 2012, which in turn claims priority under 35 U.S.C. §119 from Japanese Patent Application No. 2011-107280 filed May 12, 2011, the entire contents of both are incorporated herein by reference.

BACKGROUND OF THE INVENTION

1. Field of the Invention

The present invention relates to a method for forming a through-silicon via (TSV) in a through hole of a silicon substrate in a 3D integration technique, and more specifically relates to a technique of filling an internal space of a through hole of a small diameter provided in a silicon substrate with molten solder. The present invention also relates to an interlayer connection technique whereby a plurality of silicon substrates are stacked and joined to each other.

2. Description of Related Art

A through-silicon via (TSV) technique is one of the 3D integration techniques. An optimal fabrication method and material need to be selected for the TSV, according to specifications, architecture, silicon (substrate) thickness, and overall fabrication process of a product that requires this integration technique. A "through hole" filled with a conductive material becomes wiring that functions as a conductive path after the filling, and is also referred to as a "via".

In a commonly known TSV fabrication method, a TSV is fabricated in a sequence of (1) etching silicon (substrate) to form a through hole in the silicon substrate, (2) forming an insulation film on an internal surface of the through hole, and (3) filling a remaining internal space of the through hole with a conductive material.

As a conventional technique for (3) in this sequence of the fabrication method, a process of filling with the conductive material (e.g. Cu) by plating is known. However, not only this process requires dedicated plating equipment, but also depositing the metal on the surface by plating takes time. Hence, this process has low yields.

FIG. 6 shows an example of a plating process in the conventional technique

FIG. 6(a) shows an example of plating equipment in the conventional technique. An object to be plated is placed at a position of a sample between a cathode and an anode. A plating solution contains ions of metal for plating.

FIG. 6(b) shows a situation where a void occurs in the through hole of the silicon substrate in the conventional technique. When there is such a portion that is not filled with the conductive material, the function as the conductive path cannot be sufficiently achieved. Even though the TSV conducts immediately after fabrication, there is a possibility that a conduction failure occurs as a result of deterioration with age. Thus, the conventional technique lacks reliability.

FIG. 6(c) shows a situation where the plating is not deposited (not distributed) throughout the internal space of the through hole. This is probably because, in the plating process, the metal ions contained in the solution are grown and deposited with time, and so there is a tendency that the metal deposits near an entrance between the internal space and an external space of the through hole before it reaches the internal space. In the experimental example shown in FIG. 6(c), a diameter of the through hole is $\phi=50$ μm, and a depth of the through hole (a thickness of the silicon substrate) is t=400 μm. Under conditions of smaller scales than this, a further technique is needed to prevent such a situation.

Patent Document 1 discloses a technique of small metal particles having a nanocomposite structure. Such a technique can be applied to distribute metal particles of a small diameter throughout a through hole of a small diameter to thereby form a TSV. However, even if the metal particles can be supplied in a closest packing manner, still it does not mean that the metal particles are supplied as a gap-free continuous body. Therefore, perfect filling cannot be ensured. FIG. 7 is a diagram for describing such a conventional technique that uses small metal particles.

Patent Document 2 discloses a technique whereby, for an insulation substrate made of a thermoplastic resin, a semi-molten metal mixture is formed by mixing a binder resin in metal particles, to improve interlayer connection reliability of a multilayer substrate. However, required specifications and architecture are different between the insulation substrate and the silicon substrate, and the diameter of the through hole relating to the present invention is of a much smaller order than the diameter of the via hole (through hole) in Patent Document 2.

Although the binder resin is mixed in expectation of its gap reduction effect, the use of the binder resin causes generation of gas during melting and so rather raises a possibility of a void occurrence.

SUMMARY OF THE INVENTION

One aspect of the present invention provides a method of forming a through-silicon via (TSV) in a through hole of a silicon substrate, the method including: blocking a lower end of the through hole of the silicon substrate, thereby keeping gas from flowing from the lower end of the through hole into an internal space of the through hole; placing solid solder above the through hole of the silicon substrate for subsequently filling in the through hole; evacuating a space that includes both the internal space and an external space of the through hole; melting the placed solid solder to block an upper end of the through hole of the silicon substrate by the molten solder, thereby keeping gas from flowing from the upper end of the through hole into the internal space of the through hole; and changing an evacuated state back to a previous state to cause a pressure difference between the external space and the internal space of the through hole so that the molten solder is guided to the internal space of the through hole and the internal space of the through hole is filled with the molten solder.

Another aspect of the present invention provides a silicon substrate in which a through-silicon via (TSV) is formed in a through hole by the method of forming a through-silicon via (TSV) as described above.

Another aspect of the present invention provides a method of joining a plurality of silicon substrates which are each the silicon substrate described above, the method further including: providing a plurality of solder bumps on a first silicon substrate; providing a second silicon substrate on the plurality of solder bumps; and melting the solder bumps by generating a specific temperature higher than a melting temperature of the placed solid solder. Also provided is a 3D chip where the chip includes a plurality of silicon substrates joined by this method.

BRIEF DESCRIPTION OF THE DRAWINGS

The invention and its preferred embodiments, additional objects, features and advantages will be better understood by referring to the detailed description of the exemplary embodiments when read in conjunction with the attached drawings, in which:

FIG. 4 illustrates a diagram for describing a skin effect of the metal layer according to an embodiment of the present invention.

FIG. 5 illustrates a conceptual diagram for describing a process of adding a fine powder of metal (Cu) into the through hole according to an embodiment of the present invention.

FIG. 6 illustrates a diagram showing an example of a plating process in a conventional technique according to an embodiment of the present invention.

FIG. 7 illustrates a diagram for describing a conventional technique that uses small metal particles according to an embodiment of the present invention.

DETAILED DESCRIPTION OF THE PREFERRED EMBODIMENTS

The present invention has an object of forming a through-silicon via (TSV) in a silicon substrate without using plating equipment or small metal particles, and forming an interlayer connection by stacking and joining a plurality of such silicon substrates.

In one aspect of the present invention, a through hole of a silicon substrate is filled using molten solder itself. In more detail, a lower end of the through hole of the silicon substrate is blocked, solid solder placed above the through hole (directly above or above and to the side of the through hole) of the silicon substrate is molten, and the molten solder is guided to and filled in the internal space of the through hole by a pressure difference between the external space and the internal space of the through hole.

A through-silicon via (TSV) that has no conduction failure caused by a void occurrence can be formed without a time-consuming process of depositing metal on an internal surface of a through hole by plating.

The metal layer deposited beforehand contributes to improved wettability of the internal surface of the through hole, which facilitates passage of a high frequency signal.

By forming the intermetallic compound (IMC) so as to prevent remelting in a subsequent process, a high resistance to electromigration can be attained.

Figure 1:
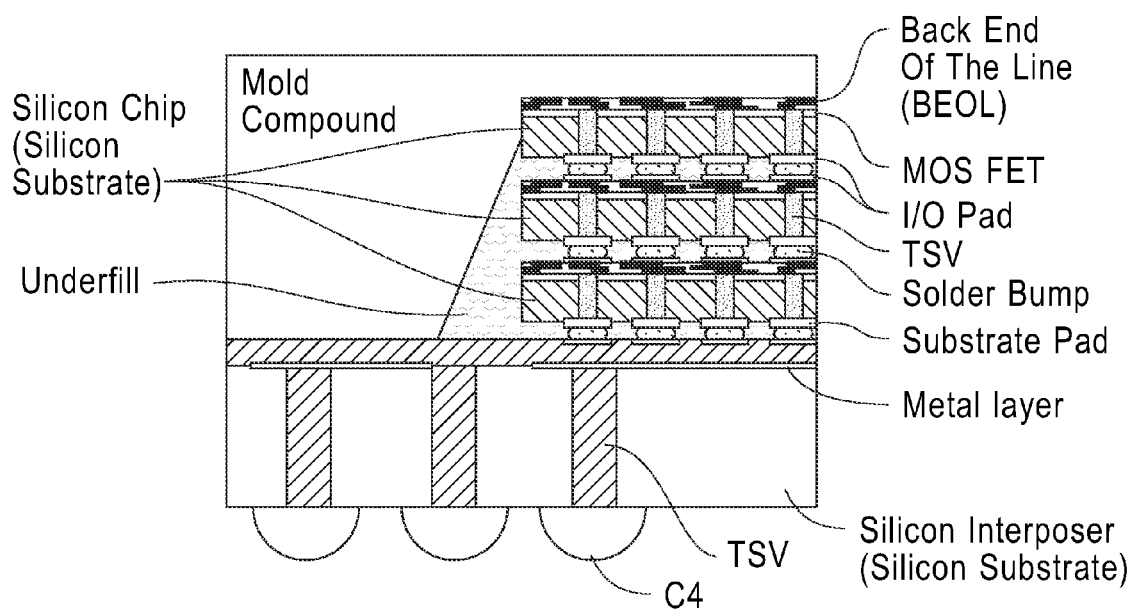
FIG. 1 illustrates a section diagram showing a 3D chips in which a plurality of silicon substrates are joined to each other according to an embodiment of the present invention.

FIG. 1 illustrates a section diagram showing a 3D stacked body in which a plurality of silicon substrates are joined to each other.

In this specification, the term "silicon substrate" has a broad concept including a silicon interposer and a silicon chip typically with a substrate shape so long as a through-silicon via (TSV) can be formed. The silicon chip is usually much thinner than the silicon interposer.

The plurality of silicon substrates are electrically and mechanically joined through fine-pitch solder bumps. The solder bumps solidified as a result of melting are shown in the drawing. The plurality of silicon substrates are joined by a process of providing a first silicon substrate, providing a plurality of solder bumps on the first silicon substrate, providing a second silicon substrate on the plurality of solder bumps, and melting the placed solid solder.

In the case where a required series of fabrication process (overall fabrication process) is such a type that stacks silicon substrates one by one in a laminated structure, it is preferable to prevent remelting even when a specific temperature equal to or higher than a temperature generated in a previous process to melt solid solder is generated in a subsequent process. This is because there is a possibility that remelting causes an already joined silicon substrate situated below to be displaced. A structure having such a resistance is referred to as a structure highly resistant to electromigration.

A metal layer can be deposited on an internal surface of the through hole beforehand, and also an intermetallic compound (IMC) can be formed in a portion other than the metal layer.

Figure 2:
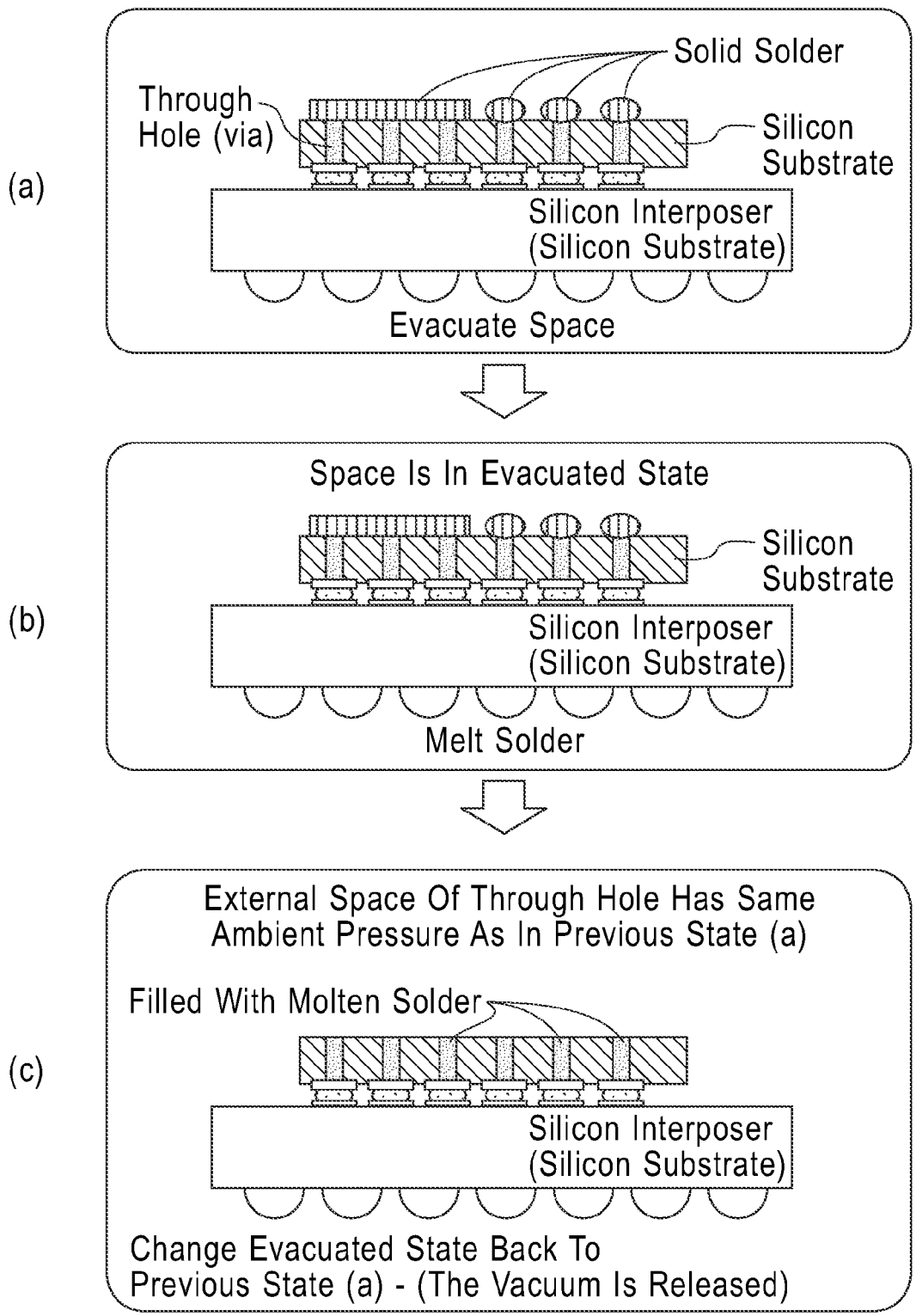
FIG. 2 illustrates a schematic diagram showing a method for forming a through-silicon via (TSV) in a through hole of a silicon substrate using molten solder itself, according to an embodiment of the present invention.

FIG. 2 is a schematic diagram showing a method for forming a through-silicon via (TSV) in a through hole of a silicon substrate using molten solder itself, according to an embodiment of the present invention.

First, a lower end of each through hole of the silicon substrate is blocked, as shown in FIG. 2(a). The blocking can be made with a molten solder bump or an I/O pad shown in FIG. 1, as long as gas is kept from flowing from the lower end of the through hole into its internal space.

In addition, sold solder prepared for subsequently filling the through hole is placed above the through hole (directly above or above and to the side of the through hole) of the silicon substrate, as shown in FIG. 2(a). The solid solder can be platelike or spherical in shape.

In this state, a space including both the internal space and the external space of the through hole is evacuated, as shown in FIG. 2(a). There is no need to fear that the internal space of the through hole can not be evacuated when the solid solder lies directly above the through hole, because the actual solid solder has innumerable projections and depressions on its surface and so there is a clearance between the internal space and the external space of the through hole.

Various techniques for evacuating both the internal space and the external space of the through hole can be conceivable by a person skilled in the art. The term "evacuation" should be broadly interpreted so long as it is a process of causing a pressure difference between the external space and the internal space of the through hole.

Next, the solder is molten in the state where the space is evacuated, as shown in FIG. 2(b). For example, heating is performed at 260° C. or higher, which is a melting point of solid solder (the melting point can be 300° C. or higher depending on solder composition). The heating method can be a method for heating the entire atmosphere or a method for heating only the solid solder (as intensively as technically possible). As a result, the placed solid solder melts and flows as a gap-free continuous body, so that the upper end of the through hole of the silicon substrate is blocked by the molten solder. This keeps gas from flowing from the upper end of the through hole into the internal space.

Lastly, the evacuated state is changed back to the previous state (i.e. FIG. 2(a)), as shown in FIG. 2(c). In other words, the vacuum is released. As a result, the external space of the through hole is brought back to the same ambient pressure as in the previous state, causing a pressure difference between the external space and the internal space of the through hole. Due to this pressure difference, the molten solder, flowing as a gap-free continuous body, is guided to the internal space of the through hole. Thus, the internal space of the through hole is filled with the molten solder.

Figure 3:
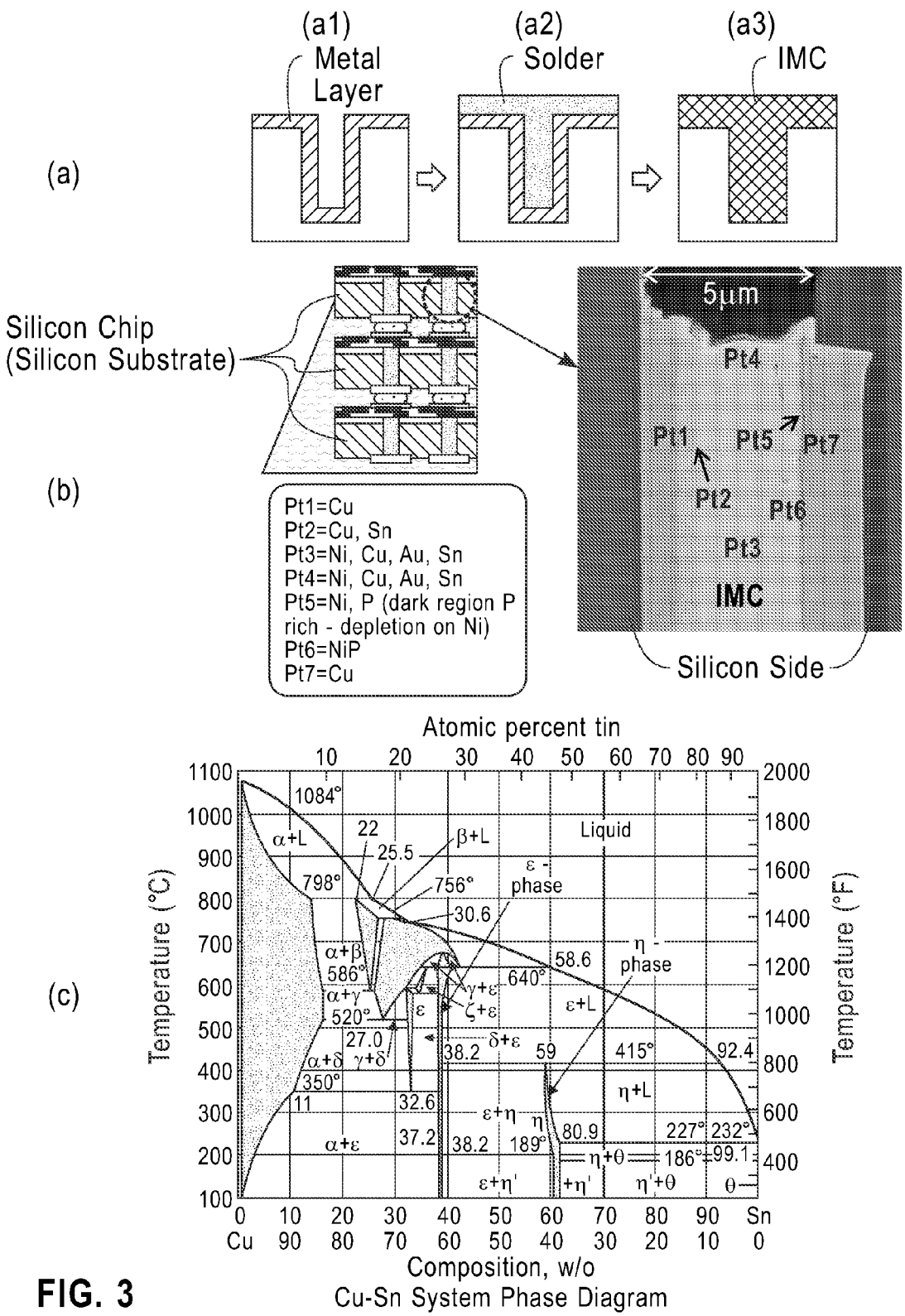
FIG. 3 illustrates a diagram for describing a structure in which a metal layer is deposited on an internal surface of the through hole of the silicon substrate and a structure in which an intermetallic compound (IMC) is formed in a portion other than the metal layer, according an embodiment of the present invention.

FIG. 3 is a diagram for describing a structure in which a metal layer is deposited on an internal surface of the through hole of the silicon substrate and a structure in which an intermetallic compound (IMC) is formed in a portion other than the metal layer, according to the present invention.

FIG. 3(a) schematically shows a process of forming the intermetallic compound (IMC) in the internal space of the through hole.

First, in FIG. 3(a1), the metal layer is deposited on the internal surface of the through hole. The deposition method can be plating (of the conventional technique shown in FIG. 6) or the like. A thin film of gold (Au), for example, is a favorable material when wettability (affinity with other metal) in the next process and the like are taken into consideration. A thin film of copper (Cu) is also applicable.

Next, in FIG. 3(a2), a different kind of metal (e.g. solder) is filled in the portion other than the metal layer deposited on the internal surface of the through hole. In FIG. 3(a3), the intermetallic compound (IMC) is formed in the internal space of the through hole.

FIG. 3(b) is a diagram showing a distribution of the intermetallic compound (IMC) formed in the case where Cu is used in the metal layer and solder (whose composition has Cu and Sn as main components) is used in the other portion. A pure metal layer is formed at Pt1, while solder of Cu and Sn is filled at Pt2 in the other portion, creating a boundary.

Moreover, a metal composition of Ni and Au is contained further inside at Pt3 and Pt4. This is probably because, in the process where the solid solder placed above the through hole (directly above or above and to the side of the through hole) of the silicon substrate is molten and guided to the internal space of the through hole so as to be filled in the through hole as shown in FIG. 2, wiring metal and the like mounted above the through hole (directly above or above and to the side of the through hole) of the silicon substrate diffuse into the solder.

FIG. 3(c) is a Cu—Sn system phase diagram showing a change in melting point of the intermetallic compound (IMC). It can be expected that a phase according to this equilibrium state appears as long as Cu and Sn are the main components of the composition. In two phases of composition ratio at two positions indicated by arrows, the intermetallic compound (IMC) with an increased melting point is formed to thereby prevent remelting in a subsequent process.

In the experimental condition in FIG. 3(b), the through hole is 5 μm or less in diameter. This demonstrates that the present invention is applicable even in such a case. The method for the present invention seems to be more advantageous when the diameter of the through hole is smaller.

FIG. 4 is a diagram for describing a skin effect of the metal layer according to the present invention.

A cross section of the through-silicon via (TSV) (as viewed from above in FIGS. 1 to 3) is schematically shown in FIG. 4. A pure metal layer is formed in a thickness portion close to the internal surface of the through hole (the periphery of the through hole), while an intermetallic compound (IMC) state (or a similar state) is formed in a portion other than the metal layer. It is commonly known that an intermetallic compound (IMC) has lower electric conductivity than pure metal.

On the other hand, metal having favorable electric conductivity is scarce in many cases, and Au, for example, is expensive metal. In view of this, it is important to take a skin depth where a skin effect appears, into consideration. Throughout the filled internal space of the through hole, substantial electric conduction occurs only in this thickness. Based on such an aspect, an appropriate thickness of the metal layer to be deposited beforehand can be determined. This eliminates waste of using redundant material, exceeding the required product specifications and architecture (overdesigned).

It is known that the skin depth by the skin effect is smaller when the frequency is higher. In copper, silver, gold, and aluminum which are typical materials having favorable electric conductivity, the skin depth is in a range of 0.64 μm to 0.84 μm when the frequency is as high as 10 GHz.

FIG. 5 is a conceptual diagram for describing a process of adding a fine powder of metal (Cu) into the through hole. This process is effective in the case of forming the intermetallic compound (IMC) as widely and reliably as possible. In the case where the metal layer deposited beforehand is made of Cu and is thick, for example, in a range of 1 μm to 9 μm, Cu can be effectively mixed in the through hole.

By adding the fine powder of metal (Cu) into the internal space of the through hole before the solder melting process, it can be expected that the intermetallic compound (IMC) is effectively formed especially by a synergic effect that the fine powder and the metal layer are made of the same metal (e.g. Cu), since the metal layer deposited beforehand is thick. The small metal particles in the conventional technique shown in FIG. 7 can be used in such a manner.

I claim:

1. A silicon substrate in which a through-silicon via (TSV) is formed in a through hole by the method of forming a through-silicon via (TSV), the method comprising:
   blocking a lower end of the through hole of the silicon substrate, thereby keeping gas from flowing from the lower end of the through hole into an internal space of the through hole;
   placing solid solder above the through hole of the silicon substrate for subsequently filling in the through hole;
   evacuating a space that includes both the internal space and an external space of the through hole;
   melting the placed solid solder to block an upper end of the through hole of the silicon substrate by the molten solder, thereby keeping gas from flowing from the upper end of the through hole into the internal space of the through hole; and
   changing an evacuated state back to a previous state to cause a pressure difference between the external space and the internal space of the through hole so that the molten solder is guided to the internal space of the through hole and the internal space of the through hole is filled with the molten solder.

* * * * *